(12) United States Patent
Stenner et al.

(10) Patent No.: US 9,530,952 B2
(45) Date of Patent: Dec. 27, 2016

(54) POWDER METALLURGICAL PRODUCTION OF A THERMOELECTRIC COMPONENT

(71) Applicants: Patrik Stenner, Hanau (DE); Mareike Giesseler, Hanau (DE); Thorsten Schultz, Hassenroth (DE); Sascha Hoch, Bochum (DE); Jens Busse, Bochum (DE); Ann-Kathrin Herr, Hanau (DE); Rüdiger Schütte, Alzenau-Hoerstein (DE)

(72) Inventors: Patrik Stenner, Hanau (DE); Mareike Giesseler, Hanau (DE); Thorsten Schultz, Hassenroth (DE); Sascha Hoch, Bochum (DE); Jens Busse, Bochum (DE); Ann-Kathrin Herr, Hanau (DE); Rüdiger Schütte, Alzenau-Hoerstein (DE)

(73) Assignee: Evonik Industries AG, Essen (DE)

( * ) Notice: Subject to any disclaimer, the term of this patent is extended or adjusted under 35 U.S.C. 154(b) by 0 days.

(21) Appl. No.: 14/388,884

(22) PCT Filed: Mar. 26, 2013

(86) PCT No.: PCT/EP2013/056327
§ 371 (c)(1),
(2) Date: Sep. 29, 2014

(87) PCT Pub. No.: WO2013/144106
PCT Pub. Date: Oct. 3, 2013

(65) Prior Publication Data
US 2015/0047685 A1 Feb. 19, 2015

(30) Foreign Application Priority Data
Mar. 29, 2012 (DE) .................. 10 2012 205 087

(51) Int. Cl.
*H01L 35/34* (2006.01)
*H01L 35/32* (2006.01)
*H01L 21/64* (2006.01)

(52) U.S. Cl.
CPC ............... *H01L 35/34* (2013.01); *H01L 21/64* (2013.01); *H01L 35/32* (2013.01)

(58) Field of Classification Search
CPC ........... H01L 35/34; H01L 21/64; H01L 35/32
(Continued)

(56) References Cited

U.S. PATENT DOCUMENTS 3,082,277 A * 3/1963 Lane ....................... H01L 35/16
136/201
6,093,338 A * 7/2000 Tani ....................... C04B 35/462
252/62.9 PZ (Continued)

FOREIGN PATENT DOCUMENTS

EP 1 928 035 A1 6/2008
EP 2 136 416 A1 12/2009
(Continued)

OTHER PUBLICATIONS

International Search Report and Written Opinion issued Dec. 23, 2014 in PCT/EP2013/056327 (with English Translation of Category of Documents).

*Primary Examiner* — Caleen Sullivan
(74) *Attorney, Agent, or Firm* — Oblon, McClelland, Maier & Neustadt, L.L.P.

(57) ABSTRACT

The invention relates to a method for producing a thermoelectric component or at least a semifinished version thereof, in which at least one thermoelectric active material in dry powder form is introduced into at least some of the holes of a perforated template. It addresses the problem of specifying a method which can be conducted in a particularly economically viable manner. The problem is solved by virtue of the (Continued)

active material remaining in the holes of the template, and the template filled with active material becoming a constituent of the thermoelectric component produced.

20 Claims, 14 Drawing Sheets

(58) Field of Classification Search
USPC .......................................................... 438/54
See application file for complete search history.

(56) References Cited

U.S. PATENT DOCUMENTS

| | | |
|---|---|---|
| 6,127,619 A | 10/2000 | Xi et al. |
| 2009/0152492 A1 | 6/2009 | Ohsora et al. |
| 2009/0272417 A1* | 11/2009 | Schulz-Harder ........ H01L 35/34 136/203 |
| 2010/0119770 A1 | 5/2010 | Hiroyama et al. |

FOREIGN PATENT DOCUMENTS

| | | |
|---|---|---|
| JP | 2010-157645 A | 7/2010 |
| WO | WO 99/65086 A1 | 12/1999 |

* cited by examiner

POWDER METALLURGICAL PRODUCTION OF A THERMOELECTRIC COMPONENT

The invention relates to a method for producing a thermoelectric component or at least a semifinished version thereof, in which at least one thermoelectric active material in dry powder form is introduced into at least some of the holes of a perforated template.

It further relates to a thermoelectric component or to a semifinished version of a thermoelectric component which has been produced by the method, and to the use thereof.

A thermoelectric component is an energy transducer which converts thermal energy to electrical energy, exploiting the thermoelectric effect described by Peltier and Seebeck. Since the thermoelectric effect is reversible, any thermoelectric component can also be used for conversion of electrical energy to thermal energy: what are called Peltier elements consume electrical power to cool or heat objects. Peltier elements are therefore also regarded as thermoelectric components in the context of the invention. Thermoelectric components, which serve for conversion of thermal energy to electrical energy, are often referred to as thermoelectric generators (TEGs).

Examples of and introductions to thermoelectric components can be found in:
Thermoelectrics Goes Automotive, D. Jänsch (ed.), expert verlag GmbH, 2011, ISBN 978-3-8169-3064-8;
JP2006032850A;
EP0773592A2;
U.S. Pat. No. 6,872,879B1;
US20050112872A1;
JP2004265988A Industrial executions of thermoelectric components comprise at least one thermocouple of thermoelectrically active material, formed from two thermolegs, and a substrate which bears and/or surrounds and electrically insulates the thermocouple from the outside.

The prior art describes a multitude of thermoelectrically active materials. Examples of suitable alloys for commercial use include those from the class of the semiconductive bismuth tellurides (especially with additional components of selenium and antimony), from which—with respective p-conductive doping and n-conductive doping—it is possible to form a thermocouple.

Further thermoelectrically active substance classes are: semi-Heusler materials, various silicides (especially magnesium, iron), various tellurides (lead, tin, lanthanum, antimony, silver), various antimonides (zinc, cerium, iron, ytterbium, manganese, cobalt, bismuth; some are also referred to as Zintl phases), TAGS, silicon germanides, clathrates (especially based on germanium). As well as these semiconductor materials, thermoelectric components can also be produced from combinations of most standard metals, as is the case, for example, for conventional thermocouples for temperature measurement, e.g. Ni—CrNi. However, the figures of merit (thermoelectric "efficiencies") achievable are much lower than in the semiconductor materials mentioned.

Conventional thermoelectric components consist of solid blocks of thermoelectrically active semiconductors and hard ceramic casings. If solid blocks are used, they are sawn out of solid ingots. It is additionally known that thermoelectrically active material can be processed by means of powder metallurgy, in order again to obtain very substantially impervious blocks (legs) with a low level of cavities.

This prior art discloses pressing the active material in pulverulent form through a perforated template, such that green bodies in the form of tablets are obtained. This template is a solid mould from the tableting apparatus. The thermoelectric green bodies pressed through the template are then sintered, arranged in a suitable manner with the aid of perforated grids and electrically connected to one another via solder bridges, the grid is removed again, remaining contact bridges are applied, and the semifinished version of the thermoelectric component thus obtained is finally completed with two top sheets of ceramic materials and optionally a lateral seal (for example by means of silicone sealing compounds) to form the ready-to-use module.

WO 2008061823 A1 discloses production of a semifinished version of a thermoelectric component by introducing thermoelectric material as a powder or solution or via the gas phase onto or into a flat porous substrate.

In the light of this prior art, the problem addressed by present invention is that of specifying a process for producing a thermoelectric component or a corresponding semifinished version, which can be performed in a particularly economically viable manner and which is particularly flexible in terms of the degrees of freedom of the geometric configuration parameters thereof.

The problem is solved by virtue of the active material remaining in the holes of the template, and the template filled with active material becoming a constituent of the thermoelectric component produced.

The invention therefore provides a method for producing a thermoelectric component or at least a semifinished version thereof, in which at least one thermoelectric active material in dry powder form is introduced into at least some of the holes of a perforated template, in which the active material remains in the holes and the template filled with active material becomes a constituent of the thermoelectric component produced.

The present invention is based on the idea of regarding the template known in the powder metallurgy production of thermoelectric components not merely as a mould, but of compressing the powder in a template which later simultaneously constitutes the thermoelectrically inactive substrate of the thermoelectric component and at the same time brings about passivation, i.e. the protection from outside influences, of the active material. It is a prerequisite of this that the template consists of a material having a minimum electrical conductivity (electrical insulator). In addition, the template must have a thermal stability sufficient for thermoelectric applications and must be available at very low cost. It is additionally advantageous when the template consists of a material having a low thermal conductivity (thermal insulator), in order to ensure that a maximum of the total heat flow through the thermoelectric component flows through the thermoelectrically active legs, where electrical power can be generated therefrom, and accordingly a minimum amount of the total heat flow flows through the template material (substrate) past the thermoelectrically active legs without benefit.

The template may consist either of impervious or porous material. The holes of the perforation are suitably executed as continuous holes which are introduced into the template, for example, by mechanical means or by means of a laser cutting technique. If the perforation is produced mechanically, one option is to execute this on the same machine which also undertakes the later pressing operation, especially with the aid of a cutting perforation tool.

For every thermocouple, two different conductive thermoelectric active materials are needed in each case, and these are electrically connected to one another, the first active material, for example, being p-conductive and the second active material n-conductive, or vice versa. "Different" means here that the two active materials have a different Seebeck coefficient. p- and n-conductive semiconductors are particularly preferred as active materials, since the Seebeck coefficients thereof have different signs (negative for n-conductors, positive for p-conductors), and therefore the numerical difference in the Seebeck coefficients is particularly large. This increases the efficiency of the thermoelectric component.

Preferably, in the method according to the invention, the two active materials are pressed in dry form. A preferred development of the invention envisages injection of the first thermoelectric active material (e.g. p-conductive) in a first portion of the holes in a first part of the method, and injection of the second thermoelectric active material (for example n-conductive) into a second portion of the holes in a second part of the method. In the first part of the method, therefore, the first legs are produced, and in the second part of the method the second legs.

In principle, it is possible in the method according to the invention to use any thermoelectric active material which can be processed by means of powder metallurgy.

Preferably, the pulverulent active material is bismuth telluride wherein the particle size distribution determined by means of laser diffraction methods has a median particle size $d_{50}$ between 1 and 100 µm, preferably between 2 and 10 µm and most preferably between 3 and 5 µm. This is because powders having these powder properties do not quite behave like fluids and accordingly convert the injection forces only insignificantly to transverse forces which could put stress on the walls of the holes and damage the template.

The particle size distributions mentioned can be determined easily and unambiguously by means of laser diffraction. A suitable instrument for determining the particle size distribution is obtainable under the LA-950 model designation from HORIBA. To measure the particle size distribution by means of a HORIBA LA-950, the powder is dispersed in demineralized water. In order to prevent sedimentation, the maximum pump circulation rate should be selected.

As already stated, the template of a thermoelectric component should if possible be a good thermal and electrical insulator. Accordingly, in the present process, a template made from a nonmetallic material is used. For this purpose, preferably high-performance polymers, for example polyether ether ketone (PEEK), polytetrafluoroethylene (PTFE), polyphenyl sulphone (PPSU), polyphenylene sulphide (PPS) or polyimides (e.g. P84® from EVONIK Industries AG), are used.

If these organic materials are unsuitable for the intended end use, material combinations based on silica or other metal oxides are possible base material for the template. Suitable silicas are available under the Aerosil® or Sipernat® trade names from Evonik Industries AG. It is possible to press sheets from these fumed or precipitated silicas, which are suitable in perforated form as a template for the performance of the present process. A process for producing insulator sheets from fumed silica is described, for example, in EP119382A1 and US20110089363A1.

Further usable composite materials are those composed of inorganic raw materials and binders as template material, for example composites consisting of mica, perlites, phlogopite or muscovite, bound by silicones, silicone resins (available under the Miglasil® and Pamitherm® brand names from the Swiss company von Roll AG) or ceramic binder systems, especially cement (available under the C-Therm® brand name from the Swiss company von Roll AG). Sheets of this kind can be perforated by means of a cutting perforation tool and can be used as a template in the context of the invention.

The thickness of the template should be 0.1 to 10 mm, preferably 0.5 to 5 mm, most preferably 1 to 3 mm. The thickness is independent of the template material and is guided by the necessary electrical properties. Preferably, the holes of the template extend essentially parallel to the surface normal of the template. In the simplest case, the template is entirely flat and therefore has only a single surface normal. If the template is of a more complicated shape, for example that of a circular arc, the surface normal is understood to mean the normal vector to the surface of the template at the centre of the hole. It follows from the orthogonal alignment of the holes to the surface of the template that the legs of the thermocouples will not extend in the plane of the template, but at right angles thereto. In this way, the thermal isolability of the template material was utilized to improve the yield of the thermocouple, since the temperature difference between the two ends of the thermocouple, which is crucial for power output, is maintained to a better degree because of the low thermal conductivity of the template.

The holes may have a circular cross section. Equally, they may have an elliptical or polygonal, especially hexagonal, cross section. In order to be able to make a uniform geometric description of various cross-sectional shapes which can be assessed in numerical form, reference is made hereinafter not to diameter, which assumes a circular shape, but to equivalent diameter. This is the diameter of a circle having the same area as the actual cross section under consideration in each case.

The equivalent diameter of the holes should be chosen with respect to the thickness of the template such that, on the one hand, a maximum packing density of the legs of the thermocouples is achieved and, on the other hand, the mechanical stability of the template is not endangered during the pressing operation and in the later utilization of the component. Depending on the template material used, the ratio of the equivalent diameter of the holes to the thickness of the template is 0.1 to 10, preferably 0.5 to 5, and most preferably 1 to 2.

Since the thermoelectric active materials to be processed have a particularly high surface area in powder form, they have a high level of oxidation sensitivity. Oxidation of the active material increases the internal resistance thereof, which reduces the efficiency of the thermoelectric element. Therefore, the invention preferably provides for performance of the method in an inert and/or reducing atmosphere. "Inert atmosphere" in this context means with appropriate exclusion of oxygen, water or other media having an oxidizing effect on the materials used, for example under protective gas such as argon or nitrogen. A reducing atmosphere may even be suitable under particularly favourable conditions for removing troublesome oxide layers from the active material or converting them to the active metallic form. Useful reducing atmospheres include especially hydrogen or hydrogenous gas mixtures. Most preferably, an atmosphere which is both inert and reducing is chosen. One option here is a gas mixture of nitrogen and hydrogen. A particularly suitable gas mixture containing 95% to 99.5% by volume of $N_2$ and 0.5% to 5% by volume of $H_2$ is known as forming gas.

Preferably, the active material is also ground and provided under an inert atmosphere (or dispersed in an anhydrous liquid).

In a preferred development of the invention, the template is supported during the injection of the active material by a backing sheet which covers the ends of at least the holes that are to be injected at that time with active material. The backing sheet absorbs the forces which occur in the course of injection and prevents, through the covering of the holes to be injected, escape of the powder from the template, since it is to remain in the template in accordance with the invention.

Preferably, the template is pressed against the backing sheet by a hold-down device during the injection of the active material, in such a way that the template is held between the hold-down device and backing sheet. In this way, the template is clamped at both ends between the backing sheet and hold-down device, which prevents destruction of the template in the course of injection of the powder. In this embodiment of the invention, the hold-down device has to be provided with a pattern of holes which corresponds to the pattern of holes in the template, in order to enable introduction of the powder. In a first step the active material is preferably introduced from a tube which extends coaxially with the hole to be filled into the hole to be filled, and in a second step the active material introduced into the hole is compressed with a ram which extends coaxially to the hole to be filled.

The cross-sectional area of the tube or the cross-sectional area of the ram should essentially correspond to the cross-sectional area of the hole. "Essentially" in this context means+/−10% deviation. Essentially equal cross sections prevent the active material from being applied to the template outside the hole, and the pressing force of the ram not being exerted solely on the powder but also on the template material surrounding the hole.

The active material need not be pressed in pure form to give a green body of the thermoleg. If necessary, it may be compressed together with at least one pulverulent additive.

According to the invention, the emphasis of the present method is on the arrangement of the powder in the template. In order to produce a functioning thermoelectric component from the semifinished version produced in this way, it is necessary to subject the active material compressed in the holes (the green bodies) to a sintering operation, in order to compact it in the holes and to obtain a sufficiently low specific electrical resistivity.

Particular preference is given to effecting the sintering operation on the active material compressed in the holes by means of current sintering methods, especially by means of what is called SPS (spark plasma sintering), i.e. by means of passage of electrical current and subsequent heating of the semiconductor structure. The sintering is preferably effected in combination with the pressing operation, by using the ram simultaneously as an electrode. The backing sheet is the counterelectrode. The sintering operation (i.e. the flow of electrical current) may set in as early as during the compaction, may follow immediately after completion of compaction, or else may be effected in the same arrangement or a similar arrangement under the same or different mechanical compressive stress at a later juncture.

As alternative to sintering by electrical current, the sintering can be effected thermally after the pressing operation, i.e. in a conventional oven operation.

Electrical contacts should be formed in a suitable manner on one side between the active materials sintered in the holes, for example by soldering. Soldering together the individual sintered active materials (thermolegs) forms the thermoelectrically active thermocouples. In addition, a multitude of thermocouples within a thermoelectric component may be connected in parallel and/or in series, in order to increase the output. The connection of the thermolegs or thermocouples is preferably effected by known soldering methodology.

When soldering, however, it should be noted that constituents of the solder (especially tin, silver, lead) can diffuse significantly into the active materials, which can have a lasting adverse effect on the performance of the thermoelectric component. In order to prevent this, what is called a diffusion barrier should be provided between the active material and solder. A suitable diffusion barrier is especially a layer of nickel, tungsten, molybdenum or carbon polymorphs, alone or mixtures thereof. Instead of applying such a layer in a known manner (sputtering, chemical vapour deposition, powder plasma spraying), the invention proposes processing of the diffusion barrier in a forming manner: Accordingly, a die is placed onto the template and a foil of barrier material, especially of nickel, is placed onto said die, and the ram is used to punch a disc out of the foil at the cutting edge of the die, and said disc is pressed onto the active material as barrier layer.

Optionally, a contact layer, for example of tin, can also be applied to the diffusion barrier, in order to achieve better binding to the diffusion barrier layer in subsequent soldering operations. The contact layer may be applied by the same methodologies as the diffusion barrier.

The invention also provides a thermoelectric component or a semifinished version of a thermoelectric component which has been produced in an inventive manner, and for the use of said thermoelectric component for conversion of thermal energy in the form of heat flows owing to different temperature levels to electrical energy (thermoelectric generator), or for conversion of electrical energy to thermal energy for generation of heat or refrigeration (Peltier element). The thermoelectric component need not necessarily be used in an energy-converting machine, but can also be used in a measuring instrument (e.g. thermometer) which merely conducts a small energy conversion for measurement purposes. The invention therefore also includes the use of the component as a temperature sensor for measuring temperatures.

It is a further particular advantage of this invention that the use of the template material between the thermoelectric active materials enables particularly good thermal insulation of these "dead spaces", which concentrates the heat flows through the component that have to be exploited in the thermoelectrically active regions in a particularly effective manner, while what are called "thermal short-circuits" past the thermoelectrically active legs are minimized, which maximizes the system efficiency (the energy yield or exploitation). In a conventional thermoelectric component, air is present between the thermoelectrically active legs at standard pressure. The thermal conductivity of air at standard pressure and room temperature, neglecting convection, is already about 26 mW/(m*K). Given the gap widths in the millimeter range that are typically present in conventional components, there are additionally significant contributions resulting from convective heat transport and radiation, and so the result may be much higher effective thermal conductivities, especially at higher hot-side temperatures. Silica-based substrates used in accordance with the invention, in contrast, typically have, under the above conditions, effective overall thermal conductivities of well below 25 mW/(m*K); values of 18-22 mW/(m*K) can be exhibited in many cases. By virtue of the particularly effective reduction in radiative heat exchange between the hot and cold sides, the advantage over conventional components grows to a disproportionate degree with rising hot-side temperature.

Thus, the inventive thermoelectric components are particularly superior at higher use temperatures.

DESCRIPTION OF FIGURES

The present invention will now be illustrated in detail by working examples. The figures show, in schematic form.

FIG. 1 shows the production process according to the invention for a thermoelectric component or a semifinished version thereof in schematic form. In a first step (I), an as yet unperforated sheet 1 is subjected to multiple mechanical perforation by a cutting perforation tool 2, so as to form a perforated template. Then, in a first filling step (II), a mask 3 is arranged above the now perforated template 4 and filled with a first thermoelectrically active material (e.g. p-conductive) in dry powder form. In this step, only half the holes of the perforated template 4 are filled. In a second filling step (III), the other holes are then filled with the second kind of active material, as above. The filling is effected in such a way that the two thermoelectrically active materials are alongside one another in alternation (see also FIGS. 9 and 14).

In a next step (IV), the dry powders present in the template 4 are compressed to form green bodies. In the next step (V), the pressed powder, i.e. the green bodies of the later thermolegs present in the holes, are sintered, preferably by supplying the individual powder compactates with a high electrical current (direct current or combination of direct current with alternating current), which induces heat in the powder because of the ohmic resistance and causes it to sinter. If the ram is used as an electrode, steps (IV) and (V) can rationally be combined. Optionally, it is additionally possible to heat the powder compactate by applying a pressure through the pressing device, which additionally promotes sintering of the individual particles or can make it possible to perform the operation at lower temperatures and/or with shorter hold times. Between the individual sintering steps, it is possible to conduct a quality assurance if necessary. In this way, a template 4 is obtained with sintered thermolegs 5, 6 arranged alternately therein. In order to produce a thermoelectrically active component from this semifinished version, formation of electrical contacts between the individual thermolegs in a manner known per se is required, for example by soldering (step VI).

It may be necessary, prior to soldering, to apply a diffusion barrier to the active material, in order to prevent diffusion of the solder into the active material. One option is to produce the diffusion barrier from a foil of barrier material, by placing the foil onto a die which has been placed onto the template and using the ram to punch it out as a disc on the cutting edge of the die and pressing it together with the powder. Optionally, a contact layer, for example of tin, may also be applied between the diffusion barrier and solder, in order to improve the connection between solder and diffusion barrier.

Figure 1:
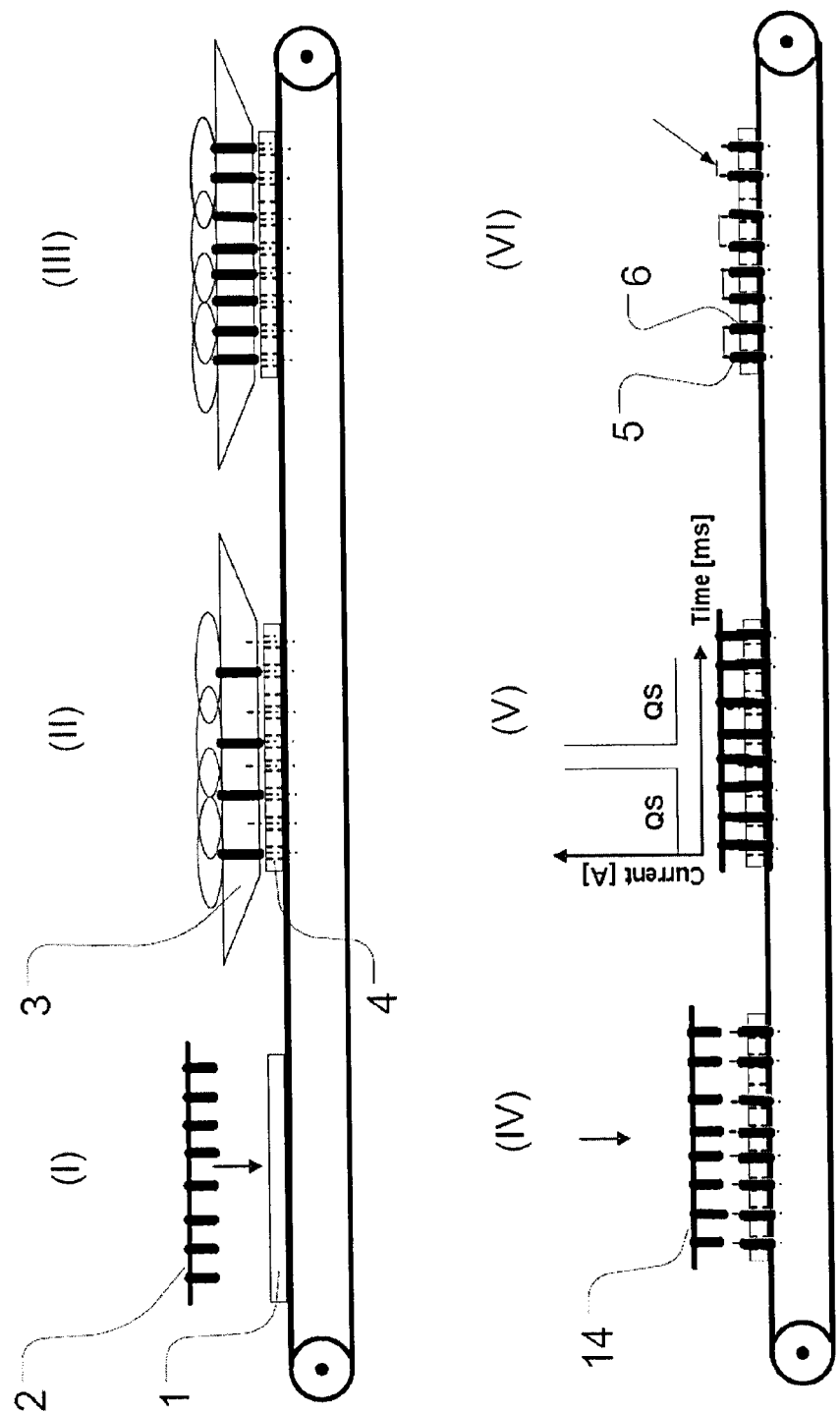
FIG. 1: Method overview.
Figure 2:
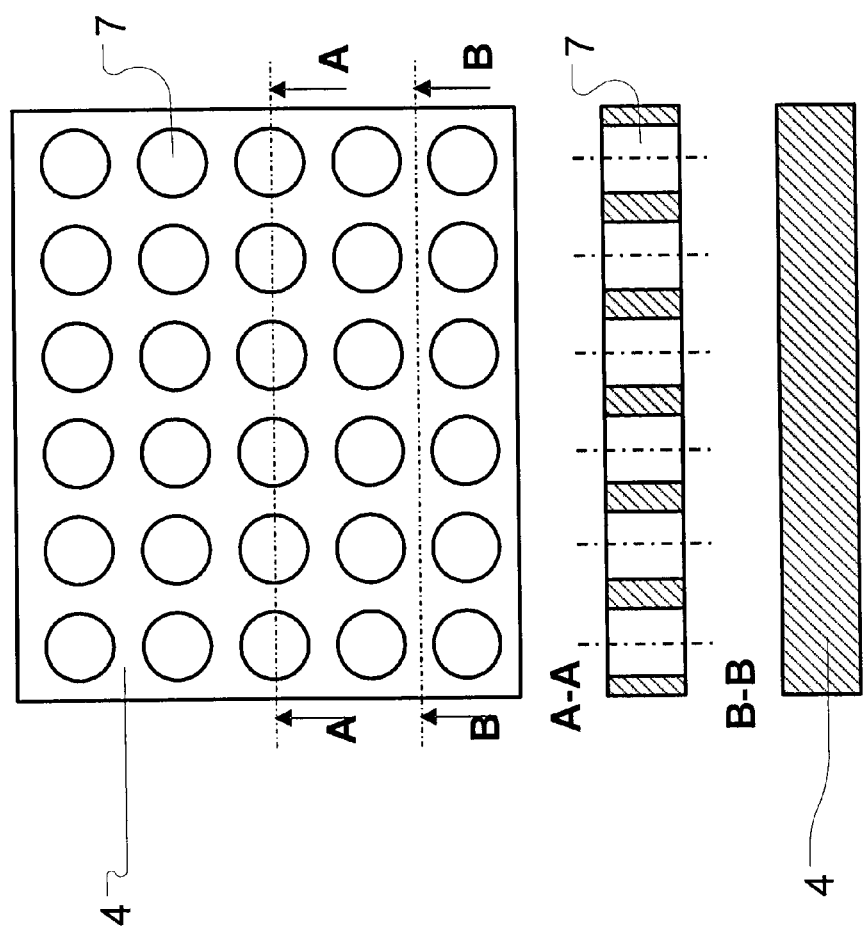
FIG. 2: Top view of template with two sections.

FIG. 2 shows, at the top, the top view of a flat, even template 4 having a multitude of holes 7, and below that two cross sections through this template at different positions.

The holes 7 are subsequently filled alternately with two different active materials, which later become the thermolegs. The holes 7 have the same diameter and a circular shape. The centres of the holes 7 are in a regular, square pattern. It is conceivable to provide non-round, especially polygonal or elliptical, holes. It is also possible for the centres to be arranged in an irregular pattern and to have different diameters. The perforation may also be arranged in an offset manner in order to obtain a greater hole density. A hexagonal honeycomb structure may also be geometrically advantageous.

Figure 3:
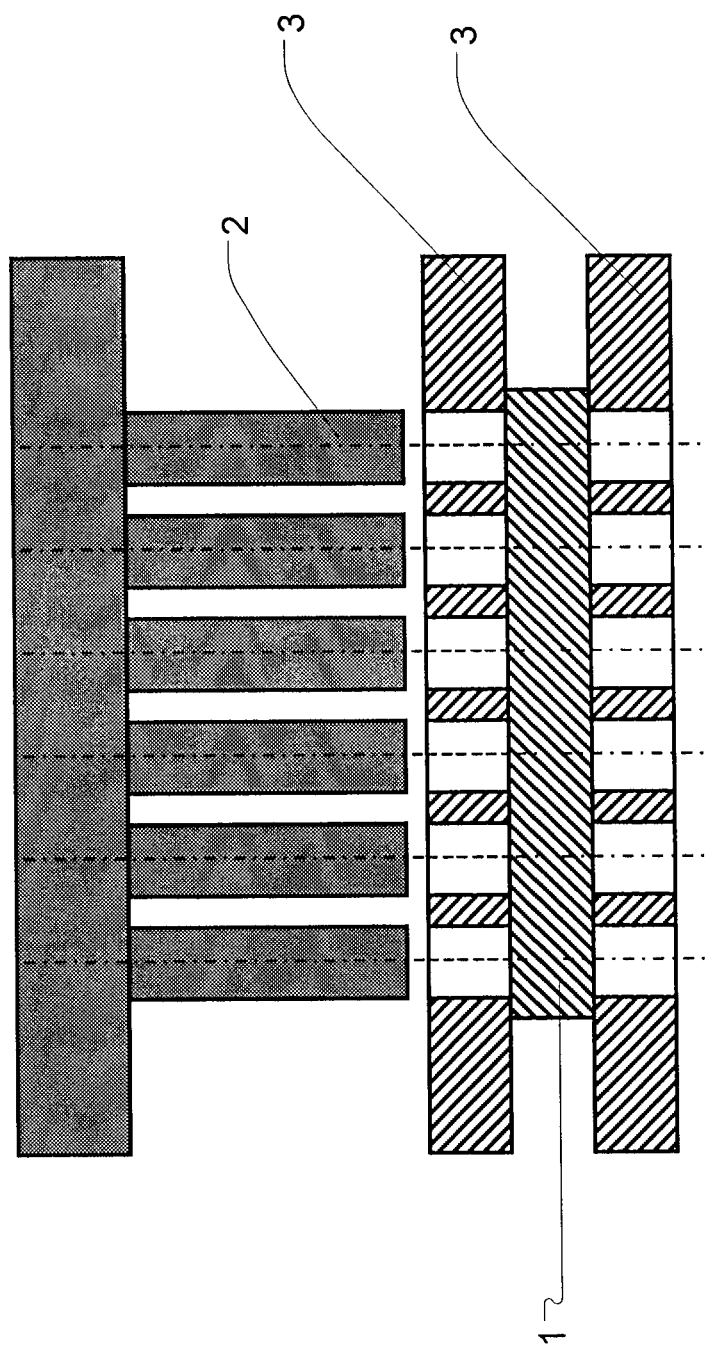
FIGS. 3 to 5: Holes in the plate.
Figure 4:
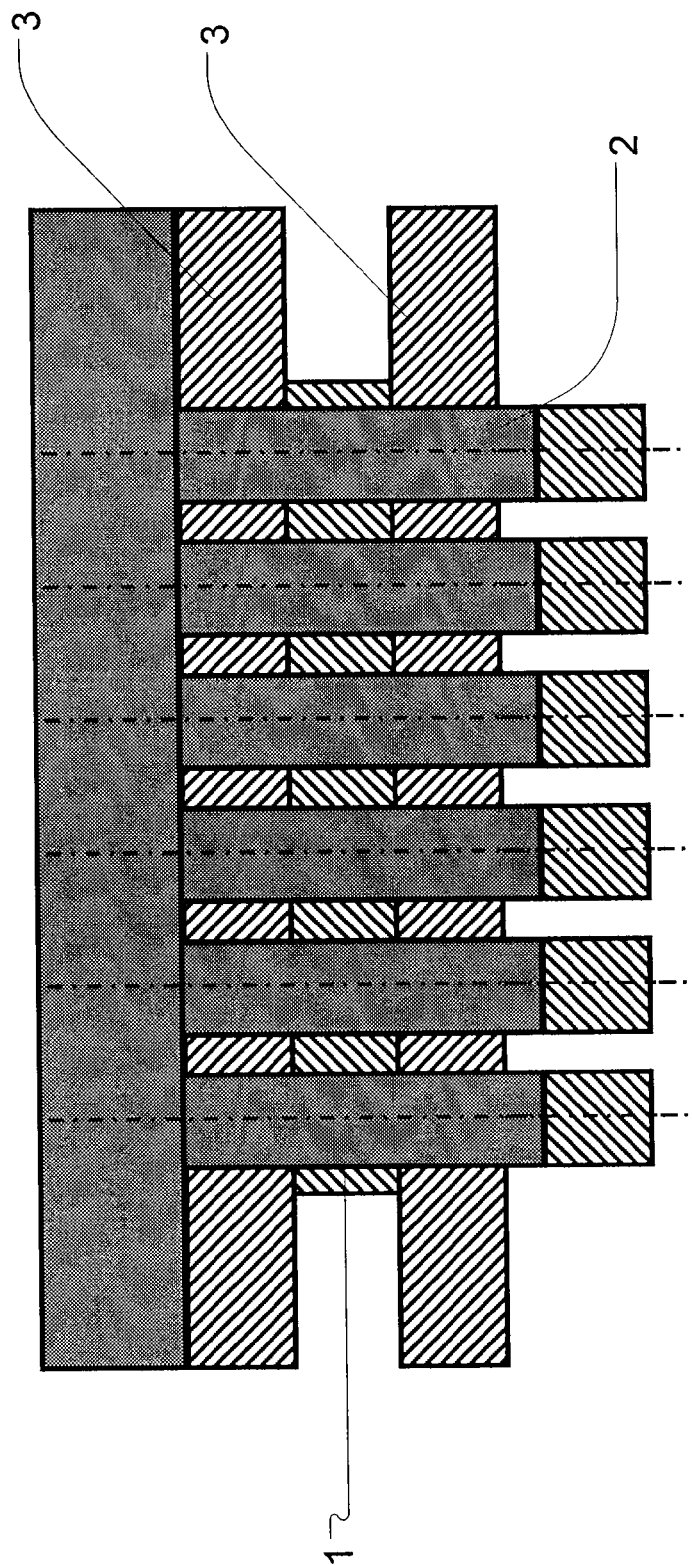
Figure 5:
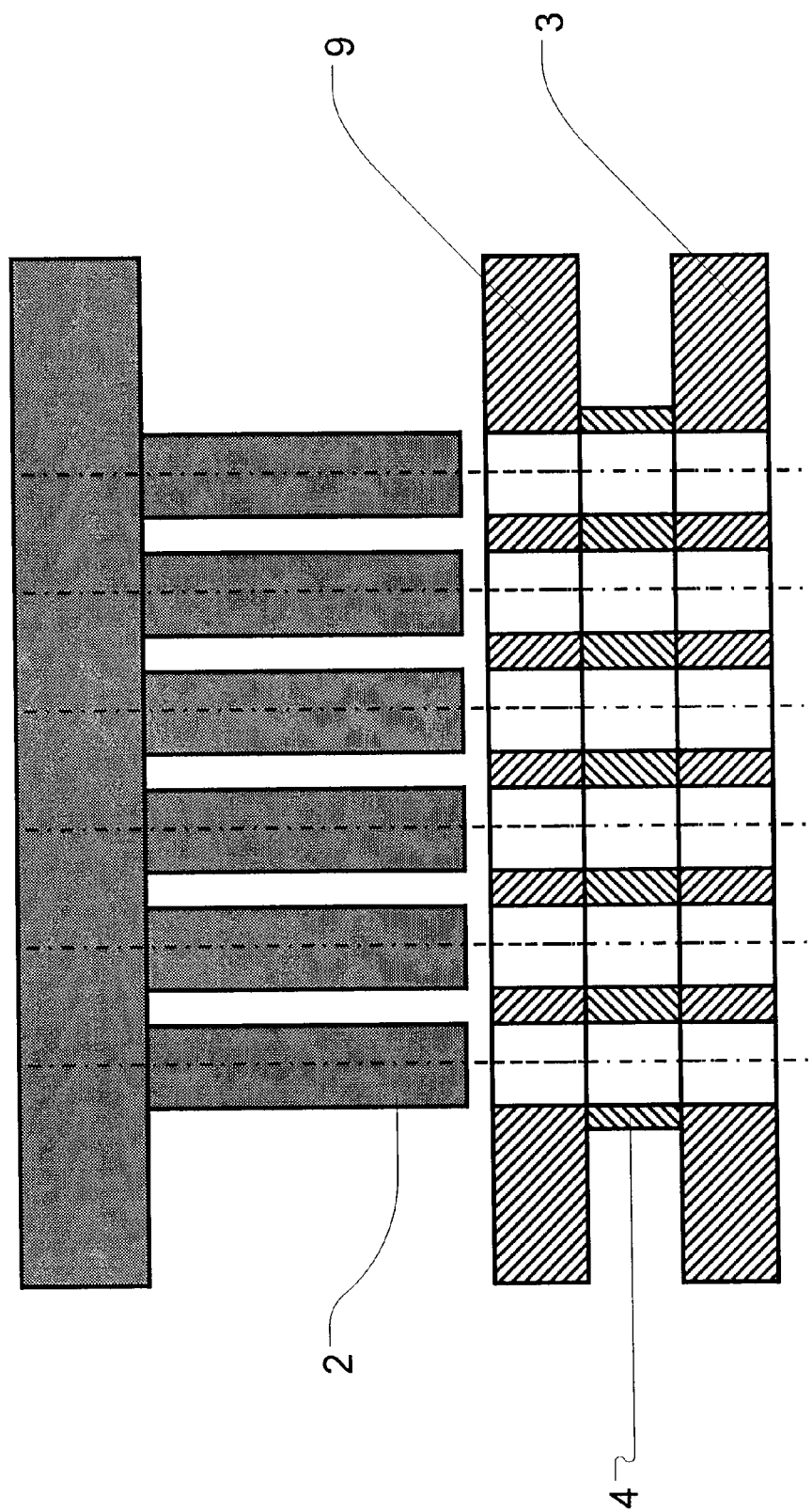

FIGS. 3, 4 and 5 once again show the production of the template 4 in a clearer manner. For this purpose, an initially unperforated sheet 1 of the chosen template material is clamped between two perforated masks 3. The masks 3 are manufactured from a metallic material and have the desire hole pattern of the template. A cutting perforating tool 2 made of metal or cemented carbide, which corresponds to the desired hole pattern, runs into the upper mask 3 and perforates the sheet 1 at the edges of the holes in the lower mask 3, so as to give a template 4 perforated in the hole pattern (FIG. 4). The perforating tool 2 is then withdrawn (FIG. 5).

Figure 6:
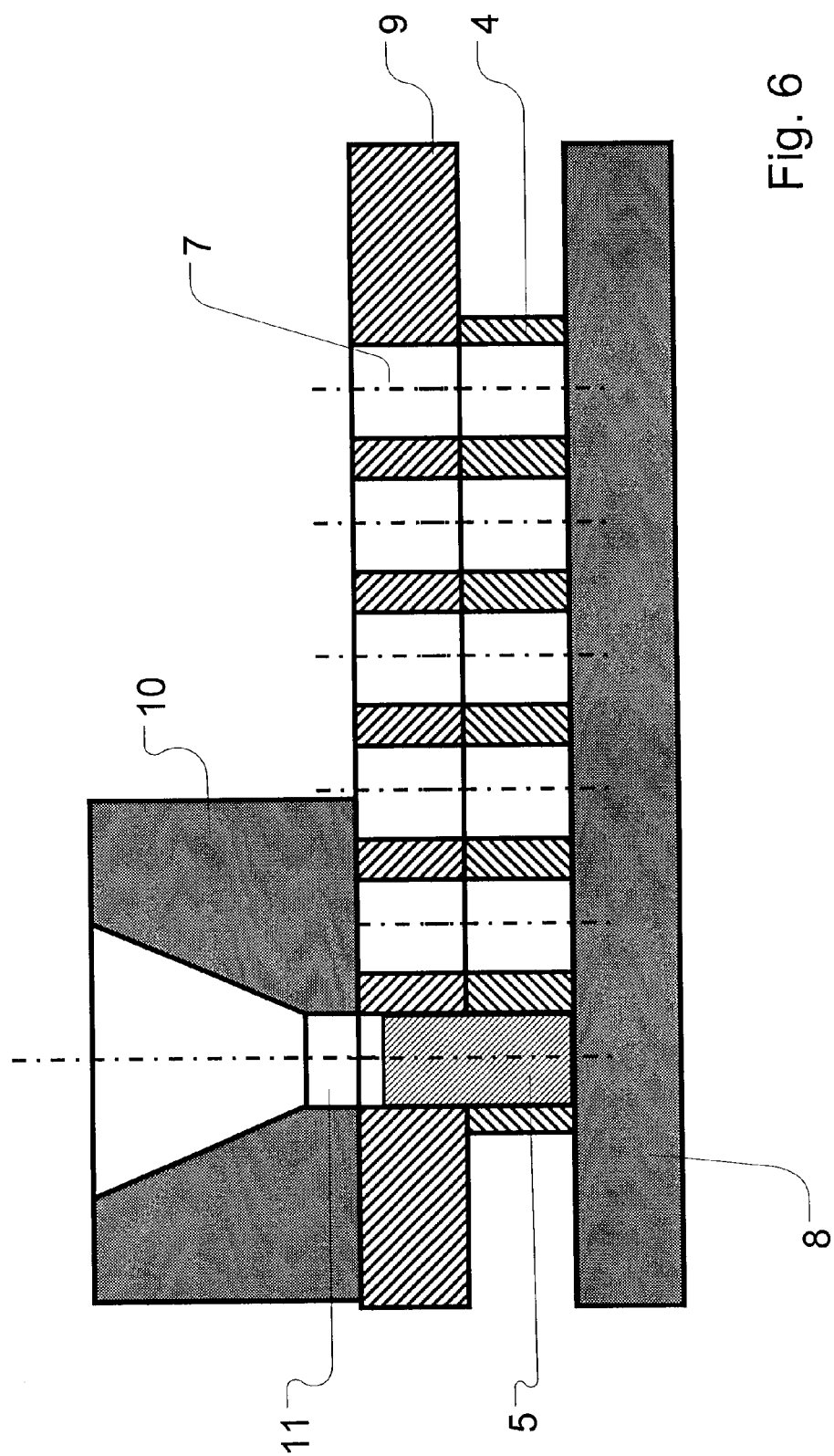
FIGS. 6 to 9: Introduction of the active material into the clamped template.

According to FIG. 6, template 4 is then placed onto a flat backing sheet 8 which closes the holes 7 at the bottom. A hold-down device 9 which has been provided with a corresponding hole pattern and is arranged in place of the upper mask presses the template 4 against the backing sheet 8. A sample reservoir 10 filled with active material 5 is positioned above the holes, and a portion of the holes 7 is filled with the active material.

During the filling, the perforated template 4 is clamped between the backing sheet 8 beneath and a hold-down device 9 which has been dropped down from above. Both the backing sheet and the hold-down device 9 are flat metal sheets. The backing sheet is not provided with a perforation, in order to cover the holes of the template 4 during the filling operation. Meanwhile, the hold-down device 9 is provided with suitable holes which allow filling of the holes of the template.

For this purpose, a sample reservoir 10 filled with pulverulent, dry active material is positioned over the particular holes in the template 4 that are to be filled. For this purpose, the sample reservoir 10 has a tube 11 which extends essentially coaxially to the hole 7 in the template that is to be filled during the filling operation. The cross section of the tube 11 corresponds essentially to the cross section of the hole 7 to be filled. During the filling, an amount of powder is introduced into the hole 7, such that the hole 7 is completely filled. In some cases, the amount of powder may also extend into the coaxially corresponding orifice in the hold-down device 9, in order to compensate for shrinkage and the reduction in the volume of the powder in the course of compaction in the pressing operation. Backing sheet 8 and hold-down device 9 are braced with respect to one another via a screw connection which is not shown (or by hydraulic/pneumatic/magnetic means).

Figure 7:
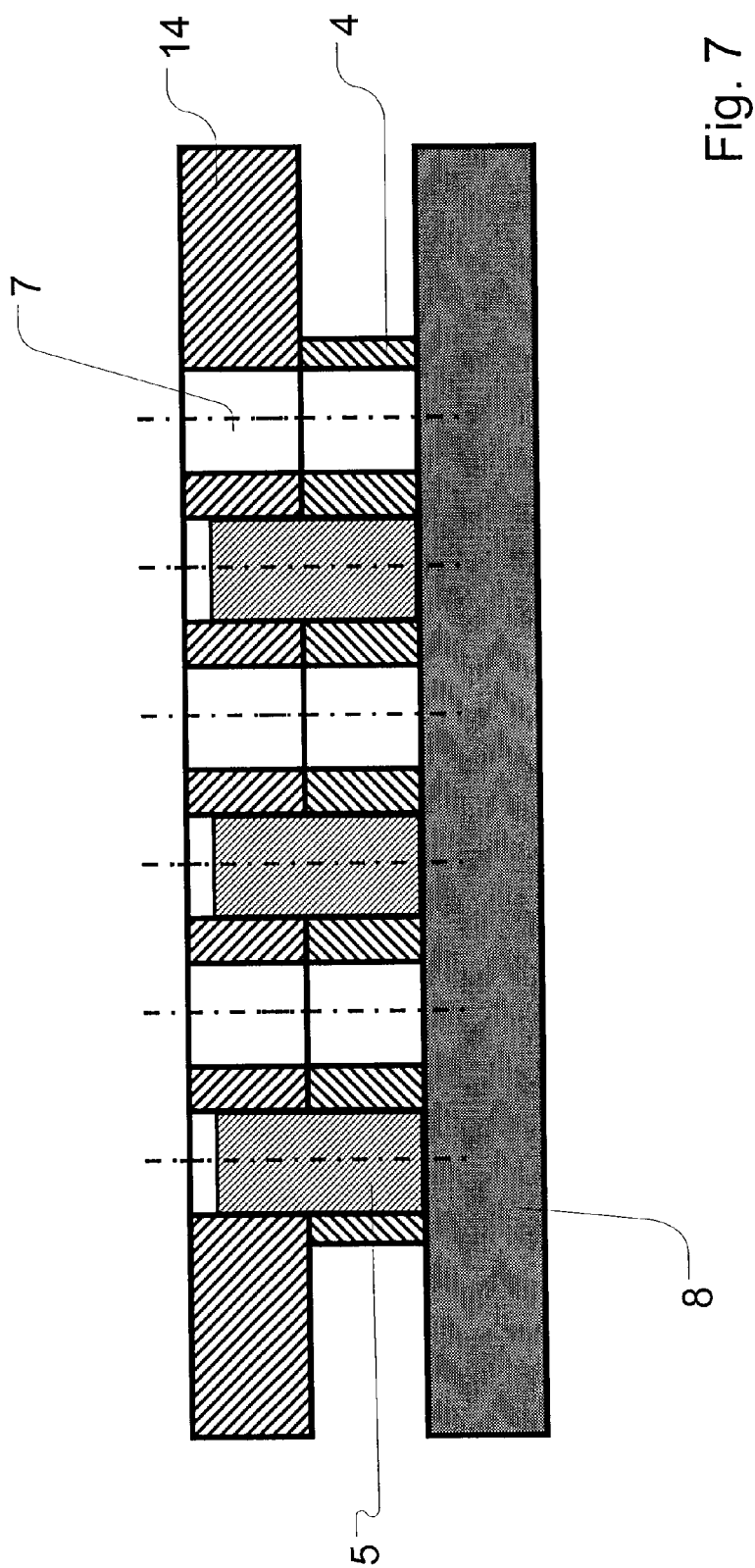
Figure 8:
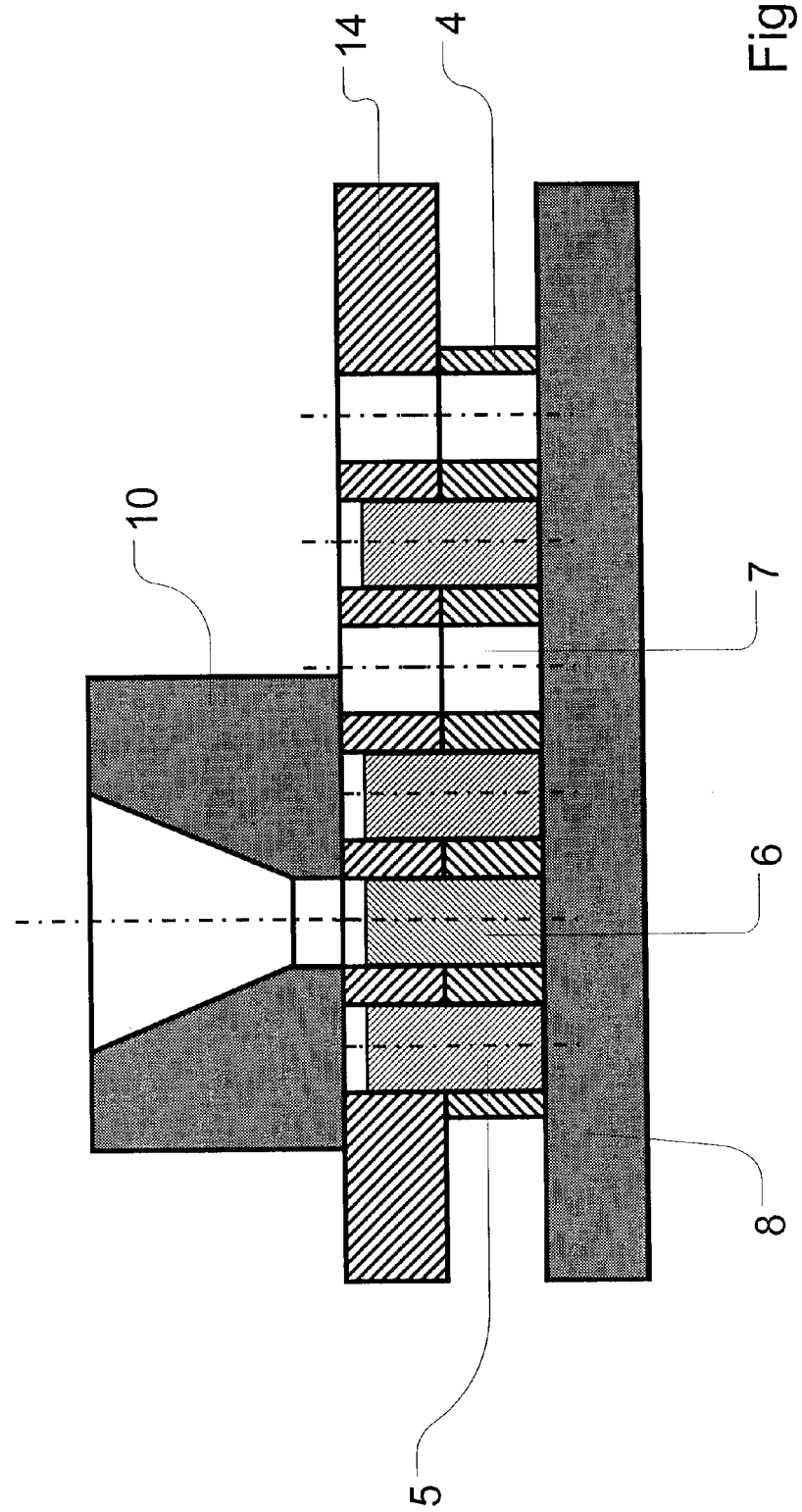
Figure 9:
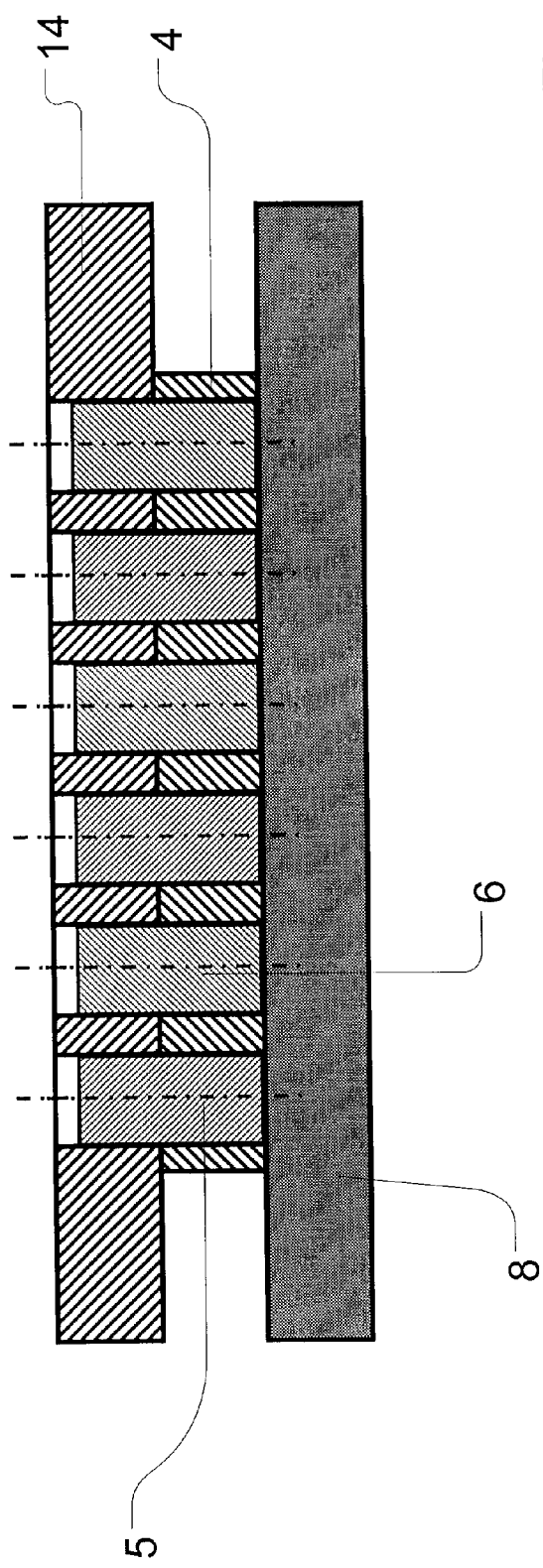

Once half the holes have been filled with one kind 5 of active material (FIG. 7), the remaining holes 7 are filled with a second kind of active material 6 (FIG. 8), such that the template 4 has been filled alternately with the two active materials 5, 6 (FIG. 9).

Figure 10:
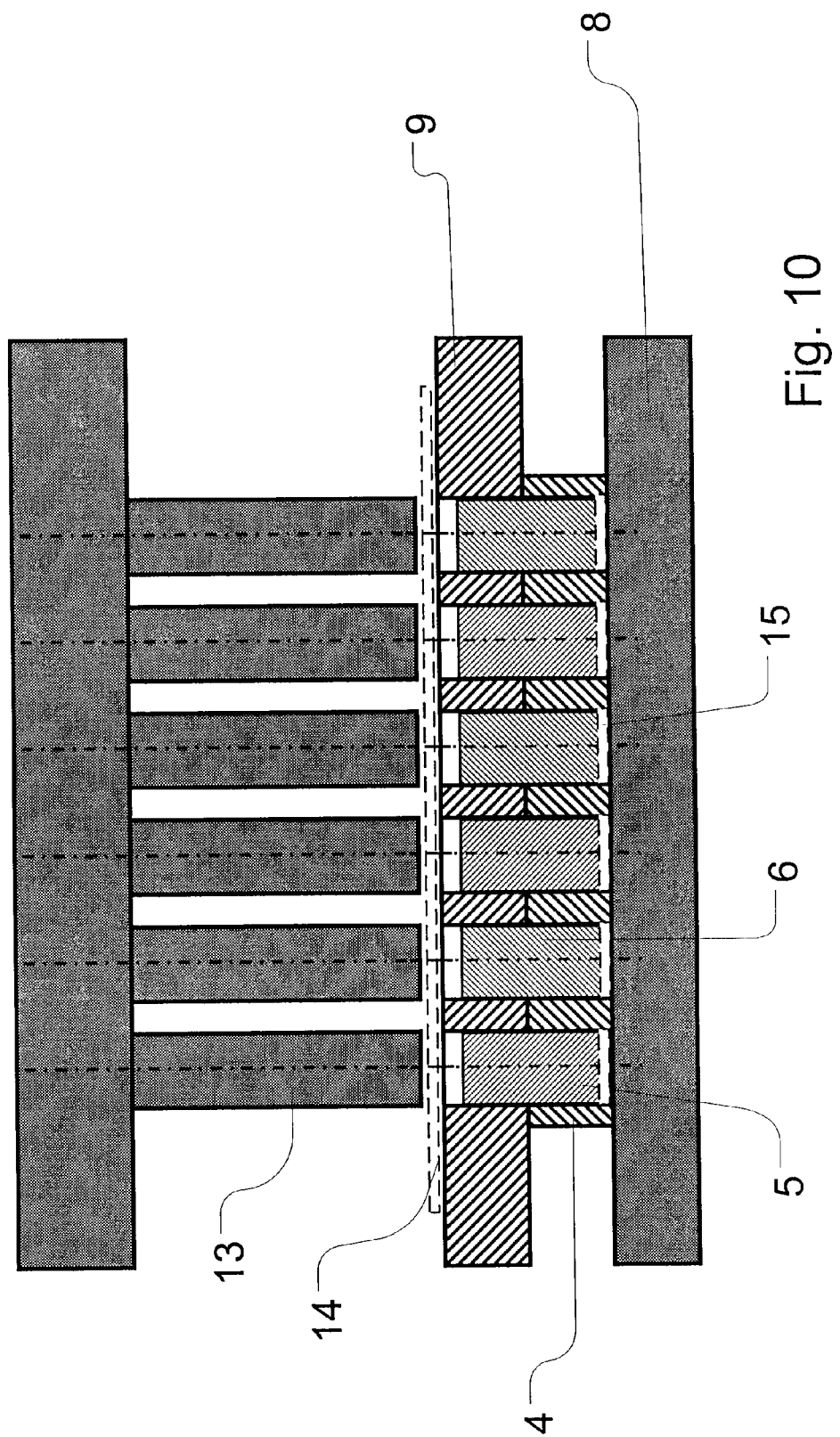
FIGS. 10 to 12: Compression and sintering of the powder.
Figure 11:
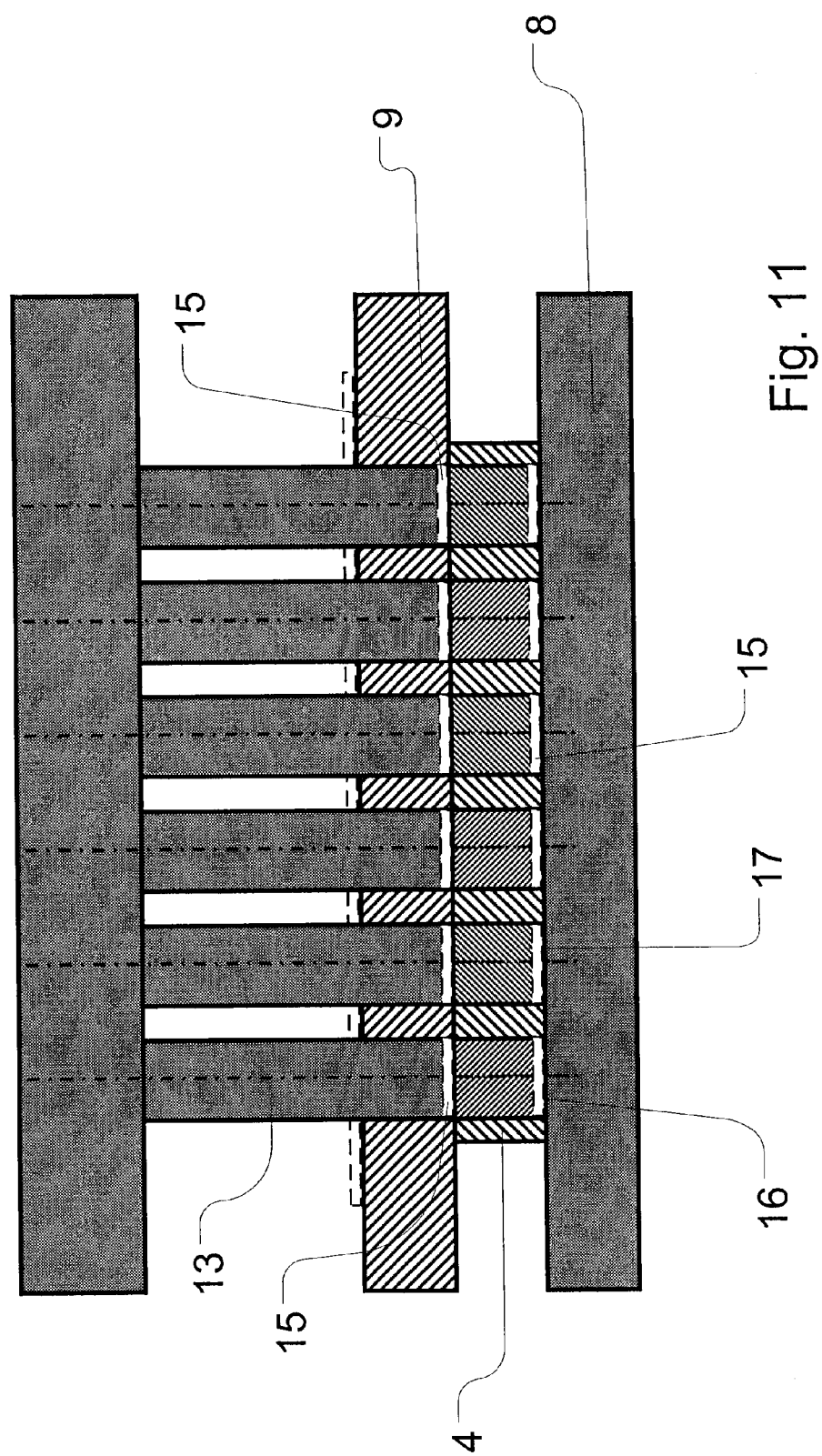

In the next step, shown in FIGS. 10 and 11, a ram 13, the cross section of which again corresponds to the cross section of the hole 7 to be compressed, drops down through the hold-down device 9 and compresses the active material in the hole 7 to give green bodies 16, 17. The pressing forces which act when the ram 13 is dropped down are absorbed by the hold-down device 9 and the backing sheet 8. Because of the particle size distribution chosen in accordance with the invention, the powder still does not behave as a fluid, and so the pressing forces exerted by the ram 13 are converted only to a small degree to transverse forces, which could radially widen the holes 7 and break the template 4.

If a barrier layer has to be applied to the active material, in order to prevent contact of the active material with the solder, one option is to press the barrier layer directly out of a foil 14: For this purpose, the foil 14, for example of nickel, is placed onto the hold-down device 9 (FIG. 10). In that case, the hold-down device 9 acts like a die when the ram 13 is dropped down: at the cutting edge between the ram 13 and hold-down device 9, one disc 15 is cut out of the foil 14 each time, and this disc is pressed onto the active material from the bottom by the hold-down device. The discs 15 then cover the powder and protect the later thermolegs from harmful influences.

In an analogous manner per se, discs 15 of barrier foil may already have been additionally introduced into the holes 7 in a preparatory step prior to the filling thereof with active material 5, 6, i.e. between the steps shown in FIGS. 5 and 6 (not shown). Thus, at the end of the pressing operation, analogously to FIG. 11, thermoleg green bodies 16, 17 are obtained, covered at both ends with discs 15 of barrier material.

Figure 12:
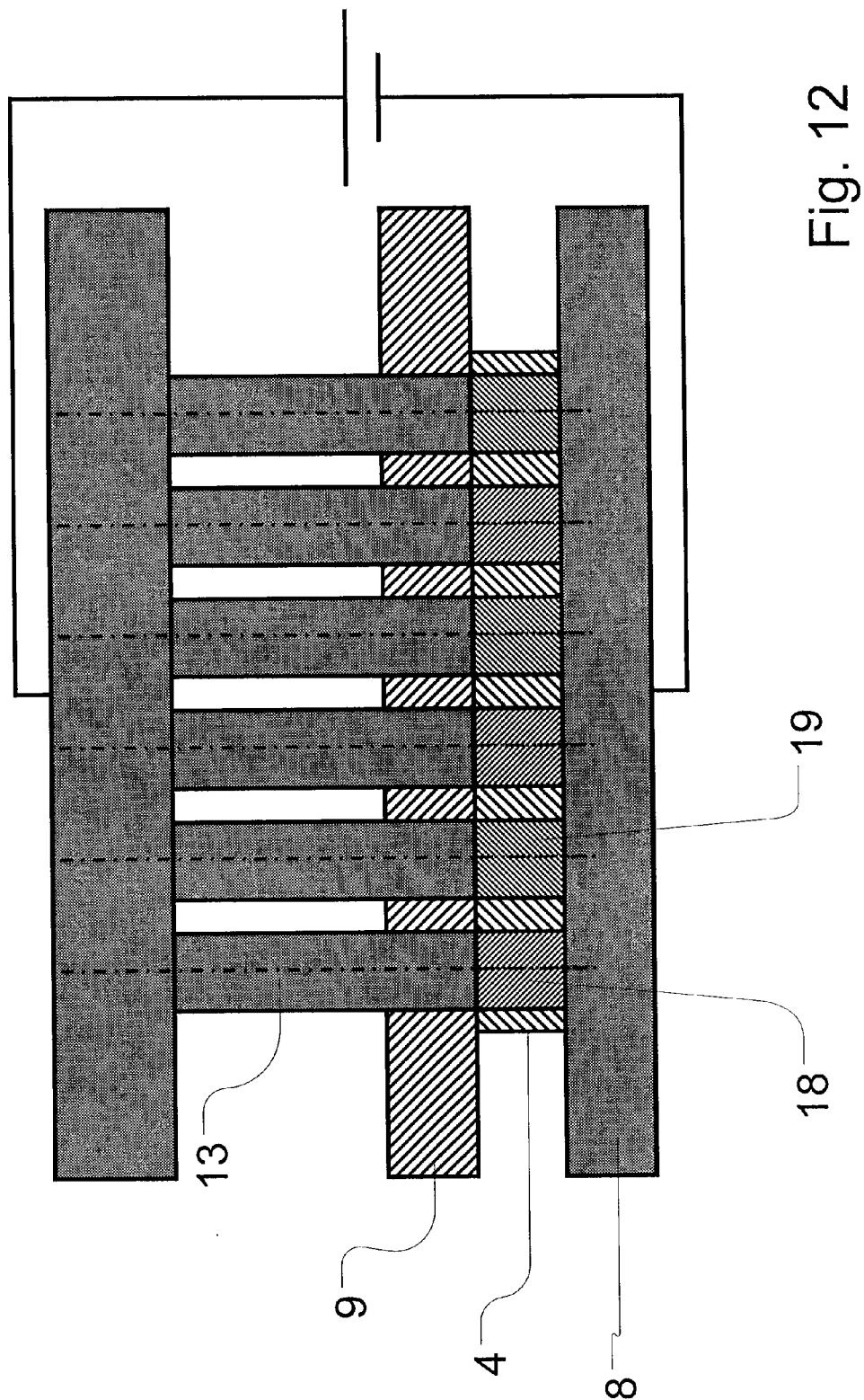

In order to sinter thermolegs 18, 19 from the green bodies 16, 17, the ram 13 is supplied with an electrical current (FIG. 12). The sintering proceeds because of the electrical current which flows through the compacting ram 13, which now acts as an electrode, through the green bodies 16, 17 to the backing sheet 8, optionally also with a certain pressure transmitted through the ram 13 to the green bodies 16, 17. Electrical voltage, current and mechanical pressure can be varied over time; see example.

Figure 13:
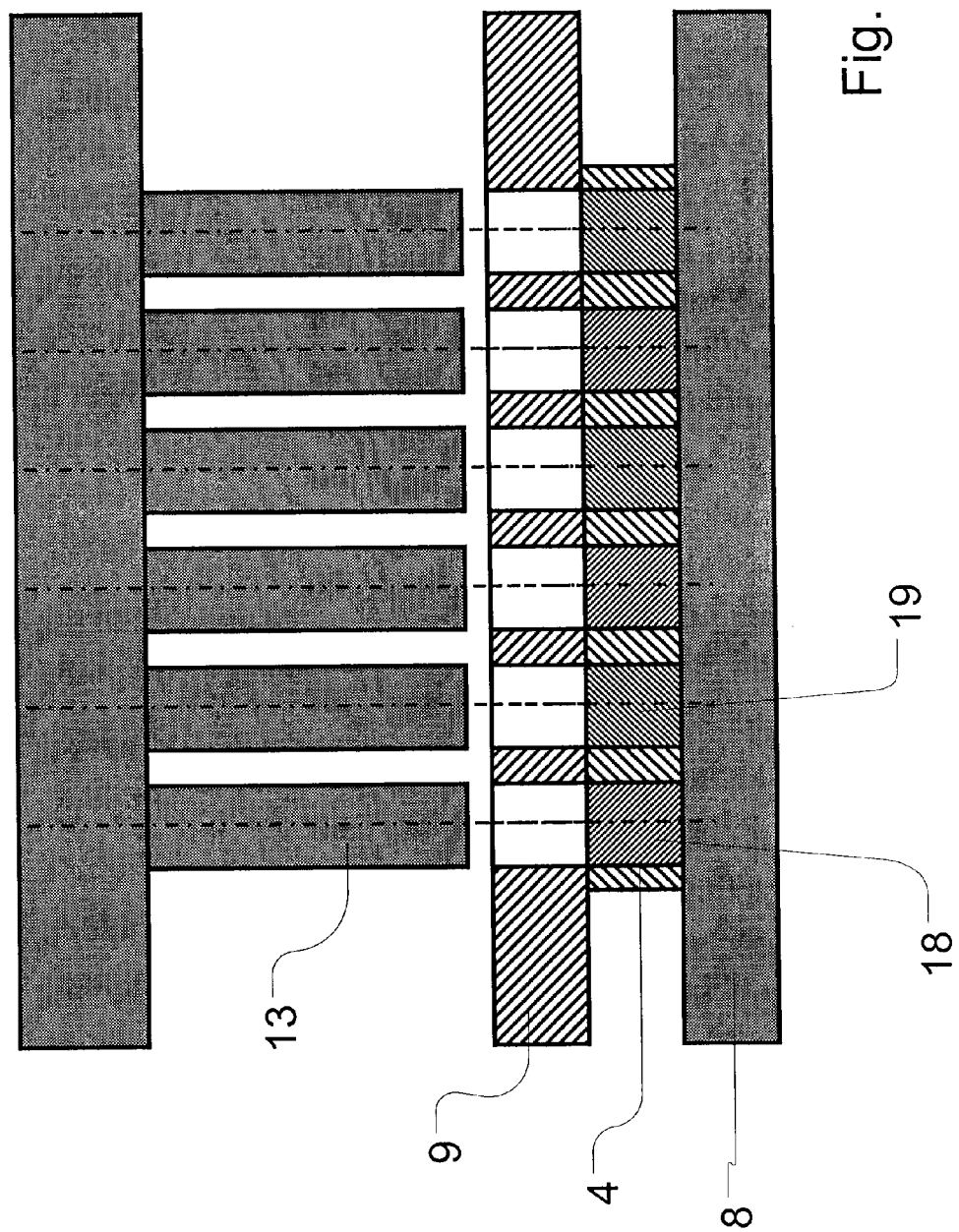
FIG. 13: Removal of the ram.
Figure 14:
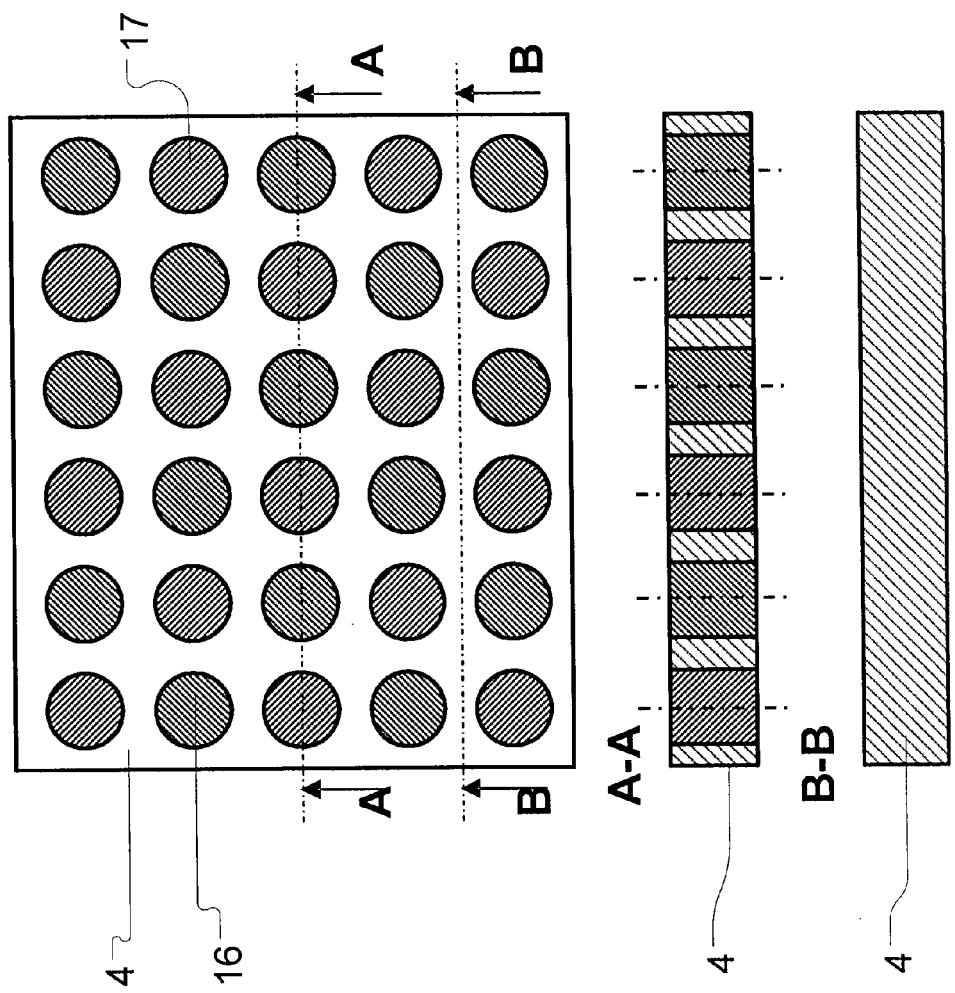
FIG. 14: Top view of semifinished version with two sections.

On completion of the sintering operation, the ram 13 is removed, such that a semifinished product (template 4 with filled thermolegs 18, 19) remains; cf. FIGS. 13 and 14.

The thermolegs should then be provided in a suitable manner with electrical contacts, for example by applying solder. If a barrier layer has been applied, the barrier layer separates the solder from the active material. In this way, a thermoelectric component is obtained.

EXAMPLE 1

The n- and p-conductive active materials (for example based on bismuth telluride of the atomic composition shown in Table 1) are introduced into a zirconium oxide grinding cup, along with zirconium oxide grinding balls, in a glove-box under a nitrogen atmosphere (5.0). The grinding cup is then clamped into a planetary mill (Fritsch Planetary Mono Mill "Pulverisette 6" classic line) and ground 10 times at 650 revolutions per minute for 15 minutes each time, with intervening pauses for the purposes of cooling (avoiding overheating of the grinding material). Thereafter, the particle size distribution is determined by means of a HORIBA 950-L (particle sample dispersed in demineralized water by means of ultrasound). If the $d_{50}$ is below 8 μm, the grinding is complete; otherwise, if required, further grinding operations are conducted with said settings until the desired $d_{50}$ or lower has been attained. The ground active material powders remain stored under nitrogen until further use

TABLE 1

Atomic composition of the active materials used according to semi-XFA (X-ray fluorescence analysis)

| Elements | p-type/wt % | n-type/wt % |
|---|---|---|
| SumBe..Fe | 0.24 | — |
| 34 + Se | 4.01 | 2.56 |
| 51 + Sb | — | 1.11 |
| 52 + Te | 41.61 | 43.5 |
| SumLa..Lu | 0.21 | 0.34 |
| 83 + Bi | 54.29 | 52.8 |

Cylindrical 4 mm holes are drilled in a sheet of solid PPSU of thickness 2 mm. This sheet serves as the substrate. A ram guide made of metal (thickness 10 mm) is placed over the substrate, having 4 mm holes at the same points as the substrate, such that the holes in the substrate and ram guide coincide with one another. Beneath this arrangement is a solid metal sheet as backing sheet. The three layers are fixed one on top of another by means of screws or clamps, such that relative movement is avoided.

Then 0.2+/−0.025 g of active material per hole is introduced into the holes of the template, and it is ensured that the powder falls down to the base, i.e. into the holes of the substrate. By alternating filling with n- and p-semiconductor material, a suitable arrangement is produced for the later thermoelectric generator.

The arrangement filled in this way is fixed on the base of a pressure test bed (e.g. ZWICK design). The mobile ram of the pressure test bed has a ram of external diameter of 4 mm and an underside which has been machined to a flat surface. This ram is then introduced successively into each of the holes of the ram guide and used to compress the powder filling. For this purpose, the ram is moved in each case at an advance rate of 1 mm per minute until an opposing force or at least 1 kN per thermoleg (corresponding to a pressure of at least 800 bar) has been attained. This force is then maintained for at least 10 seconds, or better for 60 seconds. Thereafter, the ram is pulled out of the ram guide and this operation is conducted identically in a corresponding manner for all the filled holes.

Thereafter, the substrate filled with semiconductor compactates is removed from the pressing apparatus and the visible end faces of the compactates are polished slightly by means of fine sandpaper (grain size 200), then freed of dust in a thorough manner by means of a compressed air gun.

The compactates are then subjected to a direct current sintering operation immediately thereafter. For this purpose, the substrate is placed onto a contact sheet consisting of plastic with a protruding spring-loaded nickel pin which has been ground to a flat surface and has a diameter of 4 mm. The compactate to be sintered is positioned directly above the contact pin; the pressure spring ensures a good contact over the area. By means of the pressure test bench, a nickel pin identical to the former is positioned from above exactly onto the compactate to be sintered with a contact force of 500 newtons. Then a direct current is applied, such that the temperature rises to 300° C. This temperature is kept constant for at least 5 min, and for a maximum of 30 minutes. As a result of this, the compactate sinters such that a specific resistivity of not more than 0.00001 ohm meter is measured after this procedure.

EXAMPLE 2

In an manner otherwise analogous to Example 1, the compression of the pulverulent semiconductor material is undertaken at a pressure of only 5*10⁷ Pa (500 bar). In spite of the lower pressure, nearly the same target density of the thermoleg is achieved, combined with simultaneously distinctly reduced probability of formation of structural faults (cracks, dislocations, surface material losses), lower lateral expansion of the thermoleg due to lower forces on the flanks of the hole in the substrate, and substantially homogeneous electrical and thermoelectric properties. Thus, a much lower reject rate of thermolegs is achieved. In addition, deformations on the substrate which necessitate reprocessing operations under some circumstances are substantially avoided.

LIST OF REFERENCE NUMERALS 1 sheet
2 cutting perforation tool
3 mask
4 template
5 first active material
6 second active material
7 hole
8 backing sheet
9 hold-down device
10 sample reservoir
11 tube
12 - - -
13 ram
14 foil
15 disc
16 green body (of first active material)
17 green body (of second active material)
18 thermoleg (of first active material)
19 thermoleg (of second active material)

The invention claimed is:

1. A method for producing a thermoelectric component or at least a semifinished version thereof, comprising:
    injecting a dry powder of a first thermoelectric active material into a first portion of holes of a perforated template; and
    injecting a dry powder of a second thermoelectric active material into a second portion of holes of the perforated template;
    wherein
    Seebeck coefficients of the first and second thermoelectric materials are different,
    the active material remains in the holes and the template filled with the active material becomes a constituent of the thermoelectric component.

2. The method according to claim 1,
    wherein
    the active material is bismuth telluride, and
    a median particle size ($d_{50}$) of a particle size distribution of the bismuth telluride is from 1 to 100 μm determined by laser diffraction.

3. The method according to claim 1,
    wherein
    the template consists of a thermally and electrically insulating material.

4. The method according to claim 3,
    wherein
    the template is a nonmetallic material, which is selected from the group consisting of polyether ether ketone (PEEK), polytetrafluoroethylene (PTFE), polyphenylsulphone (PPSU), polyphenylene sulphide (PPS), fumed silica, precipitated silica, metal oxides, and polyimide.

5. The method according to claim 3,
    wherein
    the template is a composite material comprising inorganic raw materials and binders,
    the binder is silicone or silicone resin, and
    the inorganic raw materials is selected from the group consisting of mica, perlite, phlogopite, and muscovite.

6. The method according to claim 1,
    wherein
    a thickness of the template is from 0.1 to 10 mm.

7. The method according to claim 1,
    wherein
    the holes of the perforated template extend essentially parallel to a surface normal of the template.

8. The method according to claim 1,
    wherein
    the holes have a circular or elliptical or polygonal cross section.

9. The method according to
    wherein
    a ratio of an equivalent diameter of the holes to a thickness of the template is from 0.1 to 10.

10. The method according to claim 1,
    wherein
    the method is conducted in at least one of an inert and a reducing atmosphere.

11. The method according to claim 10,
    wherein
    the atmosphere comprises 95% to 99.5% by volume of $N_2$ and 0.5% to 5% by volume of $H_2$.

12. The method according to claim 1, further comprising supporting the template during the injection of the active material with a backing sheet which covers the ends of at least the holes that are to be injected at that time with active material.

13. The method according to claim 12,
    wherein
    the template is pressed against the backing sheet by a hold-down device during the injection of the active material, in such a way that the template is held between the hold-down device and backing sheet.

14. The method according to claim 1,
    wherein
    in a first operation, the first and second active materials are introduced from tubes which extend coaxially with the holes to be filled into the holes to be filled, and in a second operation the active material introduced into the holes is compressed with a ram which extends coaxially to the filled hole.

15. The method according to claim 14,
    wherein
    a cross-sectional area of the tubes which extend coaxially with the holes and/or a cross-sectional area of the ram corresponds essentially to the cross-sectional area of the hole.

16. The method according to claim 14,
    wherein
    a die is placed onto the template, and
    a foil of barrier material is placed onto the die,
    the ram punches a disc out of the foil at a cutting edge of the die, and
    the disc is pressed onto the active material as barrier layer.

17. The method according to claim 1, further comprising:
    subjecting the active material compressed in the holes to a sintering operation; and
    forming, electrical contacts between the active materials sintered in the holes at least on one side of the template.

18. The method according to claim 17, wherein
the active material compressed in the holes is compacted by current sintering to form thermolegs.

19. The method according to claim 1, further comprising:
applying a diffusion barrier to the active materials; and
optionally applying a contact layer to the diffusion barrier.

20. The method according to claim 1, wherein
the dry powder active material comprises a pulverulent additive, and
the active material is compressed together with a pulverulent additive.

\* \* \* \* \*

UNITED STATES PATENT AND TRADEMARK OFFICE
CERTIFICATE OF CORRECTION

PATENT NO.      : 9,530,952 B2  
APPLICATION NO. : 14/388884  
DATED           : December 27, 2016  
INVENTOR(S)     : Patrik Stenner et al.

Page 1 of 1

It is certified that error appears in the above-identified patent and that said Letters Patent is hereby corrected as shown below:

On the Title Page

Item (73), the Assignee's information is incorrect. Item (73) should read:  
--(73) Assignee: Evonik Degussa GmbH, Essen (DE)--

Signed and Sealed this  
Seventeenth Day of July, 2018

Andrei Iancu  
*Director of the United States Patent and Trademark Office*